United States Patent
Arakawa et al.

(10) Patent No.: US 8,672,456 B2
(45) Date of Patent: Mar. 18, 2014

(54) PIEZOELECTRIC FILM, PIEZOELECTRIC DEVICE AND LIQUID EJECTION APPARATUS

(75) Inventors: Takami Arakawa, Kanagawa-ken (JP); Takayuki Naono, Kanagawa-ken (JP); Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 100 days.

(21) Appl. No.: 13/168,302

(22) Filed: Jun. 24, 2011

(65) Prior Publication Data
US 2011/0316937 A1 Dec. 29, 2011

(30) Foreign Application Priority Data
Jun. 25, 2010 (JP) ................. 2010-145102

(51) Int. Cl.
*B41J 2/045* (2006.01)
(52) U.S. Cl.
USPC .............. 347/68; 347/70; 347/71; 310/358; 252/62.9 PZ; 252/62.9 R
(58) Field of Classification Search
USPC ............... 347/68–72; 310/358; 252/62.9 PZ, 252/62.9 R
See application file for complete search history.

(56) References Cited

U.S. PATENT DOCUMENTS

| | | | |
|---|---|---|---|
| 5,004,555 A * | 4/1991 | Cheng et al. | 252/62.9 R |
| 5,719,607 A * | 2/1998 | Hasegawa et al. | 347/70 |
| 5,762,816 A * | 6/1998 | Kimura et al. | 252/62.9 R |
| 6,278,225 B1 * | 8/2001 | Nagaya et al. | 310/358 |
| 6,400,064 B1 * | 6/2002 | Yamamoto et al. | 310/323.03 |
| 6,734,607 B2 * | 5/2004 | Nagaya et al. | 310/363 |
| 6,773,621 B2 * | 8/2004 | Hammer et al. | 252/62.9 PZ |
| 2008/0231667 A1 | 9/2008 | Arakawa et al. | |
| 2009/0058955 A1 * | 3/2009 | Arakawa et al. | 347/68 |
| 2009/0114875 A1 | 5/2009 | Arakawa | |

FOREIGN PATENT DOCUMENTS

| | | |
|---|---|---|
| JP | 2008-266772 A | 11/2008 |
| JP | 2009-64859 A | 3/2009 |
| JP | 2009-117592 A | 5/2009 |
| JP | 2010-87144 A | 4/2010 |

* cited by examiner

*Primary Examiner* — Henok Legesse
(74) *Attorney, Agent, or Firm* — Birch, Stewart, Kolasch & Birch, LLP

(57) ABSTRACT

A piezoelectric film has a columnar crystal structure constituted of a plurality of columnar crystals, and contains a perovskite oxide represented by the following formula (P) as a main component:

$$Pb_a A_b[(Zr_c Ti_{1-c})_{1-d} B_d]O_e, \qquad (P)$$

where Pb and A are A-site elements, and A is at least one element selected from a group consisting of Bi, La, Ce, Pr, Nd, Sm, Eu, Gd, Tb, Dy, Ho, Er, Tm, Yb, Lu, Ca, Sr and Ba; Zr, Ti and B are B-site elements, and B is at least one element selected from a group consisting of Nb, Ta and Sb; a is an amount of lead, b is an amount of the element A, c is a Zr/Ti ratio, d is an amount of the element B, e is an amount of oxygen; values of a, b and d satisfy $a<1$, $a+b \geq 1$, and $0<d<b$; and a value of e is within a range where the perovskite structure is obtained and $e=3$ is standard.

9 Claims, 6 Drawing Sheets

FIG.6

|  | TARGET | FILM FORMATION TEMPERATURE | Pb AMOUNT a | Bi AMOUNT b | Zr/Ti RATIO c | Nb AMOUNT d | FILM FORMATION METHOD | CRYSTAL STRUCTURE | PYRO-CHLORE AMOUNT | $d_{31}$(pm/V) | LIFE SPAN |
|---|---|---|---|---|---|---|---|---|---|---|---|
| PRACTICAL EXAMPLE 1 | $Pb_{1.0}Bi_{0.15}(Zr_{0.52}Ti_{0.48})_{0.88}Nb_{0.12}O_3$ | 450°C | 0.87 | 0.13 | 0.52 | 0.12 | ONE STAGE | PEROVSKITE | 1% | 210(-) | $2 \times 10^{11}$ |
| COMPARATIVE EXAMPLE 1 | $Pb_{1.3}Bi_{0.07}(Zr_{0.52}Ti_{0.48})_{0.88}Nb_{0.12}O_3$ | 510°C | 0.97 | 0.05 | 0.52 | 0.12 | ONE STAGE | PEROVSKITE | 3% | 200(-) | $7.5 \times 10^{10}$ |
| COMPARATIVE EXAMPLE 2 | $Pb_{1.3}(Zr_{0.52}Ti_{0.48})_{0.88}Nb_{0.12}O_3$ | 510°C | 0.95 | 0 | 0.52 | 0.12 | ONE STAGE | PYROCHLORE | 83% | NOT MEASURABLE | NOT MEASURABLE |
| COMPARATIVE EXAMPLE 3 | $Pb_{1.3}(Zr_{0.52}Ti_{0.48})_{0.88}Nb_{0.12}O_3$ | 420°C150nm → 510°C | 0.97 | 0 | 0.52 | 0.12 | TWO STAGES | PEROVSKITE | NOT DETECTED | 210(+) | $8.5 \times 10^{10}$ |
| COMPARATIVE EXAMPLE 4 | $Pb_{1.3}(Zr_{0.52}Ti_{0.48})_{0.88}Nb_{0.12}O_3$ | 420°C150nm → 540°C | 0.88 | 0 | 0.52 | 0.12 | TWO STAGES | PYROCHLORE | 92% | NOT MEASURABLE | NOT MEASURABLE |
| COMPARATIVE EXAMPLE 5 | $Pb_{1.3}Bi_{0.15}(Zr_{0.52}Ti_{0.48})_{0.88}Nb_{0.12}O_3$ | 450°C | 1.06 | 0.13 | 0.52 | 0.12 | ONE STAGE | PEROVSKITE | NOT DETECTED | 160(-) | $8 \times 10^{9}$ |

PIEZOELECTRIC FILM, PIEZOELECTRIC DEVICE AND LIQUID EJECTION APPARATUS

BACKGROUND OF THE INVENTION

1. Field of the Invention

The present invention relates to a piezoelectric film, a piezoelectric device using this piezoelectric film and a liquid ejection apparatus.

2. Description of the Related Art

A piezoelectric device which includes a piezoelectric body having piezoelectric characteristics whereby the body expands and contracts with increase and decrease in the intensity of an applied electric field, and electrodes through which the electric field is applied to the piezoelectric body, are used in applications such as piezoelectric actuators mounted in inkjet type recording heads. A perovskite type oxide, such as lead zirconate titanate (PZT), is used widely as piezoelectric material. The piezoelectric material is ferroelectric and possesses a spontaneous electric polarization when no electric field is applied.

It has been known since the 1960s that PZT that is doped with various donor ions having higher valence than the valence of the substituted ions has improved properties, such as ferroelectric characteristics, compared to pure PZT. $Bi^{3+}$ and various lanthanide cations, such as $La^{3+}$, are known as donor ions which substitute for $Pb^{2+}$ at the A site. $V^{5+}$, $Nb^{5+}$, $Ta^{5+}$, $Sb^{5+}$, $Mo^{6+}$, $W^{6+}$, and the like, are known as donor ions which substitute for $Zr^{4+}$ and/or $Ti^{4+}$ at the B site.

For example, Japanese Patent Application Publication No. 2008-266772 discloses a ferroelectric film having excellent ferroelectric performance (piezoelectric performance) using a perovskite type oxide doped with 10 mol % to 40 mol % of donor ions at the B site. Japanese Patent Application Publication No. 2009-064859 discloses a ferroelectric film having excellent ferroelectric performance (piezoelectric performance), including perovskite type oxide doped with 5 mol % to 40 mol % of donor ions at the A site.

Japanese Patent Application Publication No. 2009-117592 discloses a ferroelectric film having excellent ferroelectric performance (piezoelectric performance), including perovskite type oxide doped with high-concentration donor ions at a rate of 1 mol % to 40 mol % at the A site and 10 mol % to 40 mol % at the B site. Japanese Patent Application Publication No. 2010-087144 discloses a piezoelectric film having a high piezoelectric constant when a positive voltage is applied, by limiting the amount of lead contained, the piezoelectric constant ratio, and the piezoelectric constant when a positive voltage is applied.

Japanese Patent Application Publication Nos. 2008-266772, 2009-064859 and 2009-117592 describe controlling initial characteristics by certain dopants, but include no investigation with regard to the amount of Pb and merely state that the amount of Pb may be varied within a range that yields a perovskite structure. Japanese Patent Application Publication No. 2010-087144 discloses the piezoelectric film having the improved drive durability at high humidity by reducing the amount of Pb in the film of Nb-doped PZT; however, manufacturing a film with a Pb amount of 1 or less in the $ABO_3$ structure involves laborious operations, since the film formation conditions have to be controlled in two stages, and so on. Furthermore, if the A site is limited to Pb only, then the amount of lead is limited to not less than 0.97, and if the amount of lead is less than 0.97, then the pyrochlore phase occurs. Thus, obtaining a thin film that is a perovskite single-phase film having a small amount of Pb and that yields piezoelectric performance involves laborious manufacturing operations if the amount of lead is less than 1, and is difficult if the amount of lead is less than 0.97.

SUMMARY OF THE INVENTION

The present invention has been contrived in view of these circumstances, an object thereof being to provide a piezoelectric film, a piezoelectric device and a liquid ejection apparatus whereby it is possible to obtain drive durability in high humidity by reducing the amount of lead in the film.

In order to attain the aforementioned object, the present invention is directed to a piezoelectric film which has a columnar crystal structure constituted of a plurality of columnar crystals, and contains a perovskite oxide represented by the following formula (P) as a main component:

$$Pb_a A_b[(Zr_c Ti_{1-c})_{1-d} B_d]O_e, \tag{P}$$

where Pb and A are A-site elements, and A is at least one element selected from a group consisting of Bi, La, Ce, Pr, Nd, Sm, Eu, Gd, Tb, Dy, Ho, Er, Tm, Yb, Lu, Ca, Sr and Ba; Zr, Ti and B are B-site elements, and B is at least one element selected from a group consisting of Nb, Ta and Sb; a is an amount of lead, b is an amount of the element A, c is a Zr/Ti ratio, d is an amount of the element B, e is an amount of oxygen; values of a, b and d satisfy a<1, a+b≥1, and 0<d<b; and a value of e is within a range where the perovskite structure is obtained and e=3 is standard.

According to this aspect of the present invention, since the total amount (a+b) of A-site elements is not less than 1 and the amount (a) of Pb is less than 1, then it is possible to obtain the perovskite single-phase piezoelectric film having piezoelectric characteristics, and it is possible to provide the piezoelectric film having a higher drive durability due to the low amount of lead. Furthermore, since the amount of the element A for substitution at the A-site and the amount of the element B for substitution at the B-site are within the ranges described above, it is possible to prevent decline in the piezoelectric constant.

Preferably, film formation conditions are not changed during film formation processing of the piezoelectric film. More preferably, the film formation conditions involve temperature control.

According to these aspects of the present invention, since it is possible to carry out the film formation without changing the film formation conditions (e.g., the temperature) during the film formation, then it is possible to readily form the piezoelectric film without requiring a complicated task, such as changing the film formation conditions, or the like, during the course of film formation. "Film formation conditions are not changed during film formation" means that the conditions are not changed intentionally by variable control, but the operating conditions of the film formation apparatus may be changed unavoidably.

Preferably, the value of a in the formula (P) satisfies a<0.97.

According to this aspect of the present invention, it is possible further to raise the drive durability in high humidity, by reducing the amount of Pb.

Preferably, the value of c in the formula (P) satisfies 0.45<c<0.55.

According to this aspect of the present invention, by setting the ratio (c) of Zr and Ti to the range described above, it is possible to achieve a composition close to a morphotropic phase boundary (MPB) which is the phase transition point between a tetragonal crystal phase and a rhombohedral crystal phase, and therefore high piezoelectric performance can be achieved.

Preferably, the value of d in the formula (P) satisfies $0.1<d<0.2$.

According to this aspect of the present invention, by setting the amount of the B-site dopant B to the range described above, it is possible to obtain high piezoelectric performance. Improvement in piezoelectric performance is not observed if d is less than 0.1, but if d is 0.2 or greater, then there may be a decline in the characteristics which have been improved by the A-site dopant A. Therefore, it is desirable to set the amount of the B-site dopant B to the range described above.

Preferably, the element A in the formula (P) is Bi.

In a PZT film in which donor ions substitute only at the B site of the PZT, the bipolar polarization-electric field curve (PE curve) displays asymmetrical hysteresis biased toward the positive electric field side. According to this aspect of the present invention, since Bi is added at the A site, then this complements for loss of Pb, and the asymmetry of the hysteresis of the PE curve is eased, making it possible to achieve the PE curve which is close to symmetrical hysteresis. Therefore, it is possible to improve piezoelectric characteristics both when applying the positive electric field and when applying the negative electric field, which is desirable from the viewpoint of driving.

Preferably, the element B in the formula (P) is Nb.

According to this aspect of the present invention, by using Nb as the B-site dopant B, it is possible to improve the piezoelectric performance.

In order to attain the aforementioned object, the present invention is also directed to a piezoelectric device, comprising: the piezoelectric film as described above; and electrodes through which an electric field is applied to the piezoelectric film.

In order to attain the aforementioned object, the present invention is also directed to a liquid ejection apparatus, comprising: the piezoelectric device as described above; and a liquid ejection member which is arranged integrally with or separately from the piezoelectric device, wherein the liquid ejection member includes a liquid storage chamber in which liquid is stored, and a liquid ejection port through which the liquid is ejected externally from the liquid storage chamber.

The piezoelectric film according to this aspect of the present invention has excellent drive durability at high humidity, and also has excellent piezoelectric performance, and therefore is suitable for use in a piezoelectric device and a liquid ejection apparatus.

According to the piezoelectric film of the present invention, it is possible to improve piezoelectric performance by adding donor ions for substitution at the B site. Moreover, by adding donor ions for substitution at the A site, it is possible to make a film of a perovskite oxide, and it is also possible to reduce the amount of Pb by the substitution at the A site, which means that drive durability can also be improved. Furthermore, since the amount of the element A for substitution at the A-site is made greater than the amount of the element B for substitution at the B-site, it is possible to prevent decline in piezoelectric performance.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 6 is a table showing the conditions and the results in Examples.

DETAILED DESCRIPTION OF THE PREFERRED EMBODIMENTS

Piezoelectric Film

Figure 1:
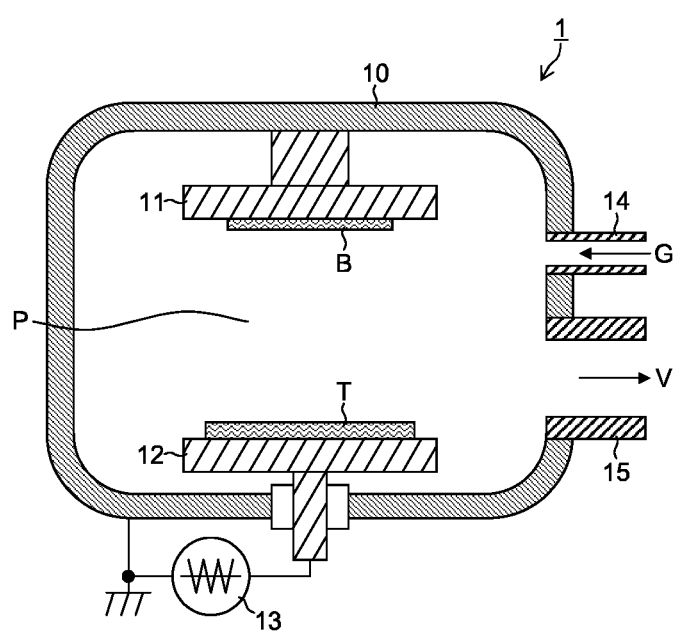
FIG. 1 is a schematic cross-sectional diagram of a sputtering apparatus.

A piezoelectric film according to an embodiment of the present invention is mainly composed of a perovskite oxide represented by the following general formula (P):

$$Pb_aA_b[(Zr_cTi_{1-c})_{1-d}B_d]O_e, \qquad (P)$$

where Pb and A are A-site elements and A is an A-site dopant, a is the amount of lead, and b is the amount of the A-site dopant A; Zr, Ti and B are B-site elements and B is a B-site dopant, c is the Zr/Ti ratio, and d is the amount of the B-site dopant B; and e is the amount of oxygen. The values of a, b and d in the perovskite oxide (P) satisfy $a<1$, $a+b\geq 1$, and $0<d<b$. It is desirable that $a<0.97$. By making the amount of Pb small, it is possible to improve drive durability. The value of e in the perovskite oxide (P) is within a range where the perovskite structure is obtained, and e=3 is the standard.

It is said that the PZT type perovskite oxide displays high piezoelectric performance at the morphotropic phase boundary (MPB) and the vicinity thereof. In the PZT material, if the material is Zr-rich, then the material assumes a rhombohedral structure and if the material is Ti-rich, then the material assumes a tetragonal structure; the boundary between the rhombohedral structure and the tetragonal structure, in other words, the MPB, is in the vicinity of the molar ratio of Zr/Ti=55/45. Consequently, it is desirable that the value c in the above-described general formula (P) coincides with the MPB composition or the vicinity thereof. More specifically, it is desirable that $0.45<c<0.55$.

It is desirable that the B-site dopant B, which represents one or more substitute elements at the B site, serves as donor ions having higher valence than tetravalent Zr and Ti. Possible examples of the B-site dopant serving as donor ions include: Nb, Ta and Sb; and Nb is especially desirable. It is desirable that the range of d representing the amount of B-site dopant B is $0.1<d<0.2$.

In the present embodiment, the relationship between the amount b of the A-site dopant A and the amount d of the B-site dopant B is $0<d<b$. By making the amount b of the substitute donor ions at the A site greater than the amount d of the substitute donor ions at the B site, it is possible to make the total amount (a+b) of A-site elements not less than 1 even if the amount a of Pb is reduced, and therefore drive durability can be improved.

It is desirable that the A-site dopant A is of bivalent or trivalent, from the viewpoint of compensating for the lack of Pb, and trivalent dopant is desirable since an effect in improving the piezoelectric performance is obtained by doping with the donor ions. The A-site dopant A of bivalent or trivalent is at least one element selected from a group consisting of Bi, La, Ce, Pr, Nd, Sm, Eu, Gd, Tb, Dy, Ho, Er, Tm, Yb, Lu, Ca, Sr and Ba, and is desirably Bi. In the general formula (P), the range of b representing the amount of A-site dopant A is desirably b≥0.05, from the viewpoint of reducing the amount of lead in order to improve durability.

The PZT film in which PZT is doped with donor ions at the B site has the PE curve displaying asymmetrical hysteresis biased toward the positive electric field side, but by being doped with donor ions at the A site also, the asymmetry of the PE hysteresis curve is eased and the PE hysteresis curve approaches symmetry. Making the PE hysteresis curve approach symmetry is desirable from the viewpoint of driving, since it becomes easier to utilize piezoelectric characteristics both with application of a positive electric field and application of a negative electric field. In particular, by using Bi as the A-site dopant, it is possible to make the PE hysteresis curve approach symmetry, and a piezoelectric film having excellent piezoelectric performance can be manufactured.

According to the present embodiment, it is possible to improve piezoelectric characteristics of the PZT film by doping with donor ions at the B site. Moreover, by further doping with donor ions at the A site, it is possible to ease the asymmetry of the hysteresis curve produced by doping with donor ions at the B site. Further, by making the amount b of the donor ions at the A site greater than the amount d of donor ions at the B site, it is possible to reduce the amount of Pb, and therefore it is possible to improve the drive durability. Furthermore, since the total amount of elements at the A site is not less than 1, then it is possible to stably form the perovskite structure film.

According to the present embodiment, it is possible to provide a piezoelectric film having excellent drive durability. The drive durability can be measured under the average life span measurement conditions described below. The measurement conditions given below are extremely severe, but a long life span has been obtained with the piezoelectric film according to the present embodiment, and it can be expected to achieve an even longer life span under actual operating conditions.

Measurement Conditions for Average Life Span

A piezoelectric device is prepared by forming a lower electrode on the substrate side of a piezoelectric film and forming a plurality of upper electrodes on the other side of the piezoelectric film opposite to the substrate, and the piezoelectric constant $d_{31}$ of the piezoelectric film in this state is measured. Each upper electrode has a layered structure in which a 20 nm-thick Ti film and a 150 nm-thick Pt film are arranged successively from the piezoelectric film side, and the surface area of each upper electrode is 0.6 mm².

The piezoelectric constant $d_{31}$ measured with a 1 kHz sinusoidal drive voltage having an offset of 10 V and an amplitude of +10 V is defined as "$d_{31}(+)$". The piezoelectric constant $d_{31}$ measured with a 1 kHz sinusoidal drive voltage having an offset of −10 V and an amplitude of ±10 V is defined as "$d_{31}(-)$".

When $d_{31}(+) \geq d_{31}(-)$, a 100 kHz trapezoid wave of 12.5 V 12.5 V is applied. When $d_{31}(-) \geq d_{31}(+)$, a 100 kHz trapezoid wave of −12.5 V+12.5 V is applied. In either of these cases, the application of voltage is cut off after every $10^8$ cycles (in other words, every 16.7 minutes (=$10^8$/100 kHz)), the value of tan δ at 1 V, 1 kHz is measured with an LCR meter, and the point where the thus measured tan δ exceeds 0.1 is determined as the end of life. The average of the measured life spans at 20 points selected at random from the upper electrodes on the piezoelectric film is derived as the average life span.

According to the present embodiment, it is possible to provide a PZT type piezoelectric film having a piezoelectric constant $d_{31}$ of not smaller than 200 pm/V. Here, a "piezoelectric constant $d_{31}$ of not smaller than 200 pm/V" means that at least one of the above-described $d_{31}(-)$ and $d_{31}(+)$ is 200 pm/V or greater.

Method of Manufacturing Piezoelectric Film

A piezoelectric film of which the main component is a perovskite oxide represented by the above-described general formula (P) can be formed by a thermal non-equilibrium process. Possible examples of a suitable method for forming the piezoelectric film according to the present embodiment include: sputtering, plasma CVD, calcination and quenching, annealing and quenching, spraying and quenching, and the like. Of these sputtering is especially desirable.

In the thermal equilibrium process, such as sol gelation, high-concentration doping of a dopant that does not have matching valence is essentially difficult, and requires expedients such as using a sintering additive or acceptor ions, or the like. In contrast, with the thermal non-equilibrium process, it is possible to achieve high-concentration doping of donor ions without such expedients.

Furthermore, in the thermal non-equilibrium process, it is possible to form the piezoelectric film at a relatively low film formation temperature that is lower than the temperature at which Si and Pb react with each other, and therefore it is possible to form the piezoelectric film on a Si substrate having good processability, which is desirable.

In the sputtering process, factors which govern the characteristics of the formed film include: the film formation temperature, the type of substrate, the under layer composition if there is a film that has been deposited previously on the substrate, the surface energy of the substrate, the film formation pressure, the volume of oxygen in the atmospheric gas, the input power, the substrate-to-target distance, the electron temperature and electron density in the plasma, the active species density and active species lifespan in the plasma, and so on.

For example, it is possible to form a film of good quality by optimizing the film formation temperature Ts and any one of the plasma potential Vs in the plasma during the film formation, the difference Vs−Vf between the plasma potential Vs and the floating potential Vf, and the substrate-to-target distance D. More specifically, if the characteristics of the film are plotted on a rectangular coordinate graph where the film formation temperature Ts is on the horizontal axis and any one of Vs, Vs−Vf, and the substrate-to-target distance D is on the vertical axis, then a film of good quality can be formed in a particular range on the graph.

Referring to FIG. 1, a composition of a sputtering apparatus and aspects of film formation according to an embodiment of the present invention are described. Here, an RF (radio frequency) sputtering apparatus employing an RF power supply is described by way of an example; however, it is also possible to use a DC sputtering apparatus employing a DC power supply. FIG. 1 is a schematic cross-sectional diagram of the whole apparatus.

As shown in FIG. 1, the sputtering apparatus 1 includes a vacuum vessel 10, in which a substrate holder 11 and a plasma electrode (cathode electrode) 12 are arranged. The substrate holder 11 can be an electrostatic chuck, for example, and can hold the film formation substrate B and heat the film formation substrate B to a prescribed temperature. The plasma electrode can generate a plasma.

The substrate holder 11 and the plasma electrode 12 are separately disposed to face each other, and a target T is loaded onto the plasma electrode 12. The plasma electrode 12 is connected to an RF power supply 13.

The vacuum vessel 10 is provided with a gas introduction tube 14, through which a gas G required for film formation is introduced into the vacuum vessel 10, and a gas discharge tube 15, through which a gas V inside the vacuum vessel 10 is discharged. For the gas G, it is possible to use Ar, a mixed gas of $Ar/O_2$, or the like.

When forming the piezoelectric film according to the present embodiment by sputtering, it is preferable that the film formation is carried out under film formation conditions where the film formation temperature Ts (° C.) and the differential Vs–Vf (V) between the plasma potential Vs (V) in the plasma during the film formation and the floating potential Vf (V) satisfy the following Formulas (1) and (2), and more preferably satisfy the following Formulas (1), (2) and (3):

$$Ts \geq 400; \quad (1)$$

$$-0.2Ts+100 < Vs-Vf < -0.2Ts+130; \text{ and} \quad (2)$$

$$10 < Vs-Vf \leq 35. \quad (3)$$

The potential of the plasma space P is the plasma potential Vs (V). Normally, the substrate B is an insulator and is electrically insulated from the ground. Consequently, the substrate B is in a floating state and the potential thereof is the floating potential Vf (V). It is thought that atoms sputtered from the target T and moving toward the substrate B during the film formation impinge on the substrate B with the kinetic energy corresponding to the acceleration voltage of the potential difference Vs–Vf between the potential of the plasma space P and the potential of the substrate B.

Figure 2:
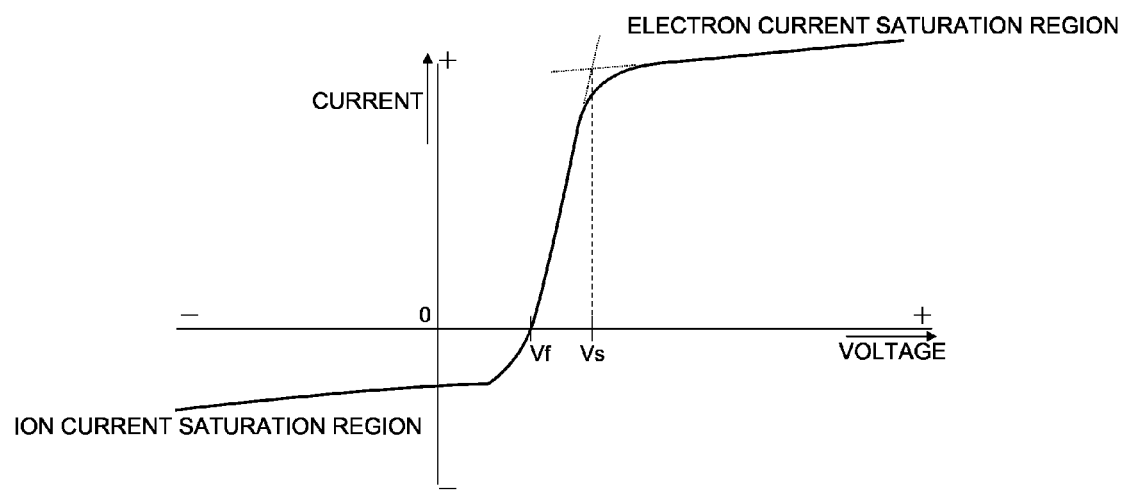
FIG. 2 is an illustrative diagram for describing a method of measuring the plasma potential Vs and the floating potential Vf.

The plasma potential Vs and the floating potential Vf can be measured through a Langmuir probe. When the tip of the Langmuir probe is inserted into the plasma space P and the voltage applied to the probe is altered, voltage-current characteristics such as those shown in FIG. 2, for example, are obtained (see "Purazuma To Seimaku No Kiso (The Essentials of Plasmas and Film Formation)", p. 90, Mitsuharu Konuma, published by Nikkan Kogyo Shimbunsha, Japan). In FIG. 2, the probe potential at which the current becomes 0 is the floating potential Vf. This is the state where the ion current flowing to the probe surface and the electronic current flowing to the probe surface become equal. The surface of metal that is in the insulated state and the surface of the substrate assume the floating potential Vf. When the voltage applied to the probe is raised above the floating potential Vf, the ion current gradually decreases, and only the electronic current reaches the probe when the voltage applied to the probe is above a boundary voltage, which is taken as the plasma potential Vs. The potential difference Vs–Vf can be changed, for instance, by placing the ground between the substrate and the target.

It is known that, in film formation of a PZT type piezoelectric film by sputtering, loss of Pb becomes liable to occur if the film formation is carried out at high temperature. The loss of Pb also depends on the potential difference Vs–Vf, as well as the film formation temperature. Pb has the greatest sputtering rate among the constituent elements of PZT, namely, Pb, Zr and Ti, and is then most readily sputtered. For example, Table 8.1.7 in "Shinkuu Handobukku (Vacuum Handbook)" (edited by Ulvac Inc., published by Ohmsha, Japan) shows the following sputtering rates under conditions of Ar ions at 300 eV: Pb=0.75, Zr=0.48, Ti=0.65. If a material is readily sputtered, then this means that, after atoms sputtered from the target have become deposited on the substrate surface, they can readily be sputtered again (re-sputtered) from the substrate surface. The greater the difference between the plasma potential and the substrate potential, in other words, the greater the potential difference Vs–Vf, then the greater the re-sputtering rate, and the more likely it becomes that Pb loss will occur.

Under conditions where the film formation temperature Ts is too low and the potential difference Vs–Vf is too small, it tends to be impossible to satisfactorily grow perovskite crystals. On the other hand, under conditions where the film formation temperature Ts is too high and/or the potential differential Vs–Vf is too large, Pb loss tends to become more likely to occur. In other words, under conditions where Ts≥400° C. which satisfies the above-described Formula (1), if the film formation temperature Ts is relatively low, then it is necessary to relatively raise the potential difference Vs–Vf in order to satisfactorily grow perovskite crystals, and if the film formation temperature Ts is relatively high, then it is necessary to relatively lower the potential difference Vs–Vf in order to suppress loss of Pb. This is expressed in the above-described Formula (2).

Furthermore, when forming a PZT piezoelectric film, a piezoelectric film having a high piezoelectric constant is obtained by specifying the film formation conditions in a range which satisfies the above-described Formulas (1), (2) and (3).

In the perovskite oxide film included in the piezoelectric film according to the embodiment of the present invention, since the dopant element A for substitution at the A site is added and the total amount of the A-site elements is not less than 1, then no pyrochlore phase appears even if the amount of Pb is reduced, and it is possible to form the perovskite type structure.

In the related art, for example, Japanese Patent Application Publication No. 2010-103546 describes that film formation is carried out under a first condition where a perovskite single-phase structure having a large amount of Pb can be stably obtained, and then the film formation is continued under a second condition where a pyrochlore phase is liable to occur. In this method of manufacture, by growing the perovskite structure as crystalline nuclei, the perovskite single-phase structure is then continuously grown under conditions where a pyrochlore phase is liable to be generated.

In contrast, according to the embodiment of the present invention as described above, since the total amount of the A-site elements is not less than 1, it is possible to obtain a perovskite single-phase structure by film formation under the same conditions, without changing the film formation conditions in two steps as in the related art, and therefore the film formation can be carried out easily.

The film which is formed by a method of this kind has a columnar crystal film structure constituted of columnar crystals. By forming a columnar crystal film structure constituted of columnar crystals which extend non-parallelly to the surface of the substrate, it is possible to obtain an oriented film having an ordered crystal orientation. By adopting a film structure of this kind, it is possible to obtain high piezoelectric characteristics.

Piezoelectric Device and Inkjet Recording Head

Figure 3:
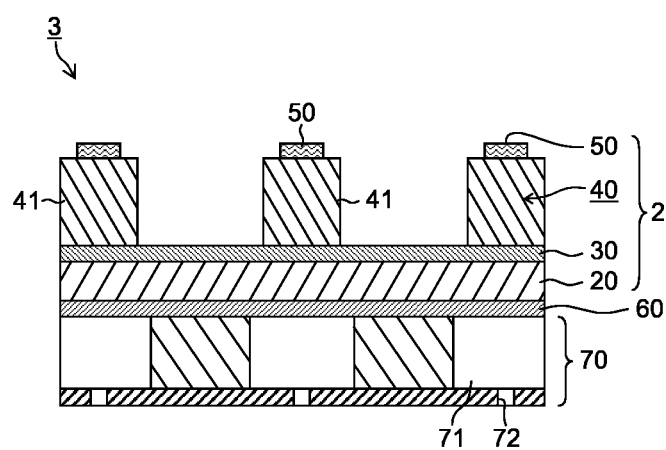
FIG. 3 is a cross-sectional diagram of the structure of a piezoelectric device and an inkjet recording apparatus.

A structure of a piezoelectric device according to an embodiment of the present invention and a structure of an inkjet recording head (a liquid ejection apparatus) having the piezoelectric device are described with reference to FIG. 3. FIG. 3 is a cross-sectional diagram showing substantial parts of the inkjet recording head. In order to facilitate visualization of the components of the inkjet recording head, the scales of the components in the drawing are made different appropriately to each other.

A piezoelectric device 2 according to the present embodiment is formed by sequentially placing a lower electrode 30, a piezoelectric film 40 and upper electrodes 50 on a substrate 20. An electric field is applied to the piezoelectric film 40 in the thickness direction thereof through the lower electrode 30 and each upper electrode 50. The piezoelectric film 40 is the piezoelectric film according to an embodiment of the present invention, which includes a perovskite oxide represented as the above-described general formula (P).

The lower electrode 30 is formed over substantially the whole surface of the substrate 20. The piezoelectric film 40 is formed on the lower electrode 30 and has a pattern of line-shaped projecting sections 41 arranged as stripes extending perpendicularly to the sheet of drawing in FIG. 3. The upper electrode 50 is formed on each projecting section 41.

The pattern of the piezoelectric film 40 is not limited to that shown in FIG. 3, and is designed as appropriate. Furthermore, the piezoelectric film 40 can be a continuous film. However, by forming the piezoelectric film 40 in the pattern having the projecting sections 41 which are mutually separated, rather than as a continuous film, the expansion and contraction of the respective projecting sections 41 is made smooth, which is desirable since a larger amount of displacement can be obtained.

There are no particular restrictions on the material of the substrate 20, and examples thereof include silicon, glass, stainless steel (SUS), yttria-stabilized zirconia (YSZ), alumina, sapphire, and silicon carbide. For the substrate 20, it is also possible to use a laminated substrate, such as an SOI substrate in which a $SiO_2$ oxide film is formed on the surface of a silicon substrate.

There are no particular restrictions on the major constituents of the lower electrode 30, and examples thereof include the metals or metal oxides such as Au, Pt, Ir, $IrO_2$, $RuO_2$, $LaNiO_3$, and $SrRuO_3$, and combinations thereof.

There are no particular restrictions on the major constituents of the upper electrodes 50, and examples thereof include the above-described examples of the major constituents of the lower electrode 30, electrode materials such as Al, Ta, Cr and Cu that are generally used in a semiconductor device, and combinations thereof.

There are no particular restrictions on the thicknesses of the lower electrode 30 and the upper electrodes 50, and each thickness can be approximately 200 nm, for instance. There are no particular restrictions on the thickness of the piezoelectric film 40, which is normally not smaller than 1 μm and can be in the range of 1 μm to 5 μm, for example. The thickness of the piezoelectric film 40 is desirably not smaller than 3 μm.

Schematically, the inkjet recording head (liquid ejection apparatus) 3 includes the above-described piezoelectric device 2 and an ink nozzle (liquid storing and ejecting member) 70 attached to a lower side of the piezoelectric device 2 in the drawing through a diaphragm 60. The ink nozzle 70 has ink chambers (liquid storing chambers) 71, which store ink, and ink ejection ports (liquid ejection ports) 72, through which the ink ejected from the ink chambers 71 to the outside. The ink chambers 71 are arranged in accordance with the number and pattern of the projecting sections 41 in the piezoelectric film 40.

In the inkjet recording head 3, the intensity of the electric field applied to each of the projecting sections 41 of the piezoelectric device 2 is changed so as to expand or contract each projection section 41, and thereby the ejection timing and the ejection amount of the ink from the corresponding ink chamber 71 are controlled.

In place of attaching the diaphragm 60 and the ink nozzle 70 as the members independent from the substrate 20, a part of the substrate 20 can be processed into the diaphragm 60 and the ink nozzle 70. For example, if the substrate 20 is constituted of a layered substrate, such as an SOI substrate, then the substrate 20 can be etched, starting from the lower surface thereof in the drawing, in order to form the ink chambers 71, and then the diaphragm 60 and the ink nozzle 70 can be formed by processing the substrate 20 itself.

The piezoelectric device 2 and the inkjet recording head 3 according to the present embodiment have the composition described above.

Inkjet Recording Apparatus

Figure 4:
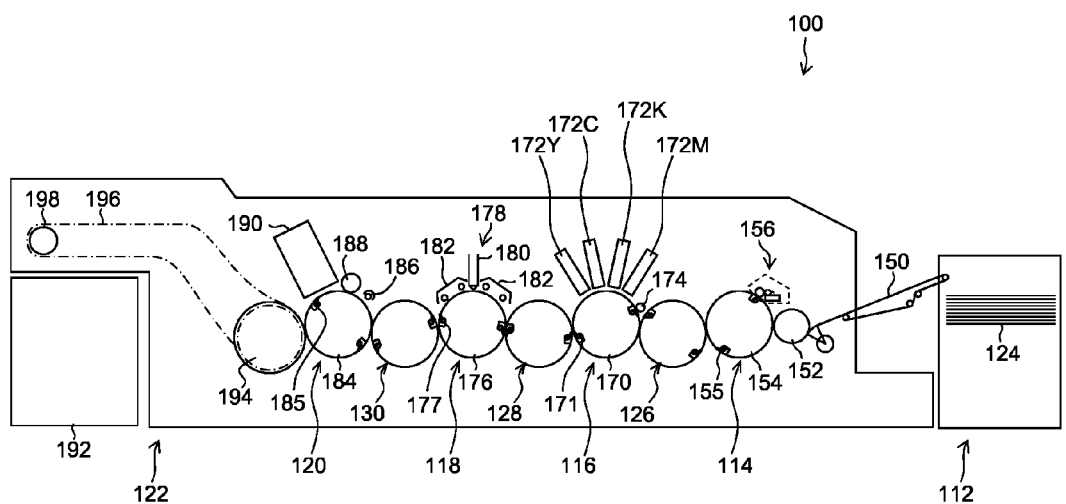
FIG. 4 is a schematic drawing showing a general view of an inkjet recording apparatus.

A configuration of an inkjet recording apparatus with the inkjet recording heads 3 (172M, 172K, 172C and 172Y) according to the embodiment of the present invention is described with reference to FIG. 4. FIG. 4 is a diagram showing the entire apparatus.

The inkjet recording apparatus 100 is of a direct-drawing type that forms a desired color image by depositing ink droplets of a plurality of colors from inkjet heads 172M, 172K, 172C and 172Y onto a recording medium 124 (often referred to as a "sheet" for convenience) that is held on a pressure drum (a drawing drum 170) of a drawing unit 116. The inkjet recording apparatus 100 is an on-demand type image forming apparatus employing a two-liquid reaction (aggregation) system for applying treatment liquid (aggregation treatment liquid) to the recording medium 124 prior to depositing the ink droplets, and then making the treatment liquid react with the ink droplets to form an image on the recording medium 124.

As shown in FIG. 4, the inkjet recording apparatus 100 mainly has a sheet feeding unit 112, a treatment liquid application unit 114, the drawing unit 116, a drying unit 118, a fixing unit 120, and a discharge unit 122.

<Sheet Feeding Unit>

The sheet feeding unit 112 is a mechanism for supplying the recording media 124 to the treatment liquid application unit 114. The recording media 124, sheets of paper, are stacked on the sheet feeding unit 112. The sheet feeding unit 112 is provided with a sheet tray 150 from which the recording media 124 are supplied, one by one, to the treatment liquid application unit 114.

<Treatment Liquid Application Unit>

The treatment liquid application unit 114 is a mechanism for applying the treatment liquid to a recording surface of the recording medium 124. The treatment liquid contains a color material aggregating agent for aggregating color materials (pigments in the present embodiment) of the ink deposited by the drawing unit 116. Contact between the treatment liquid and the ink facilitates separation of the ink into the color materials and solvent.

The recording medium 124, applied with the treatment liquid in the treatment liquid application unit 114, is delivered from the treatment liquid drum 154 to the drawing drum 170 of the drawing unit 116 through an intermediate conveying unit 126.

<Drawing Unit>

The drawing unit 116 has the drawing drum (the second conveying body) 170, a sheet pressing roller 174, and the inkjet recording heads 172M, 172K, 172C and 172Y.

Each of the inkjet recording heads 172M, 172K, 172C and 172Y is preferably a full-line type inkjet recording head (inkjet head), the length of which corresponds to the maximum width of an image forming region on the recording medium 124. An ink ejection surface of each of the inkjet recording heads 172M, 172K, 172C and 172Y has a nozzle row in which a plurality of ink ejection nozzles are arranged over the entire width of the image forming region. Each of the inkjet recording heads 172M, 172K, 172C and 172Y is installed so as to extend in a direction perpendicular to a conveyance direction of the recording medium 124 (a rotation direction of the drawing drum 170).

The inkjet recording heads 172M, 172K, 172C and 172Y eject ink droplets of the corresponding colors to the recording surface of the recording medium 124 tightly held on the drawing drum 170. As a result, the ink droplets come into contact with the treatment liquid that has been applied to the recording surface in the treatment liquid application unit 114, and consequently the color materials (pigments) dispersed within the ink are aggregated, forming a color material aggregate. This prevents the color materials from flowing on the recording medium 124, and an image is formed on the recording surface of the recording medium 124.

The recording medium 124 on which the image has been formed in the drawing unit 116 is then delivered from the drawing drum 170 to a drying drum 176 of the drying unit 118 through an intermediate conveying unit 128.

<Drying Unit>

The drying unit 118 is a mechanism for drying the moisture contained in the solvent separated by the color material aggregating action. As shown in FIG. 3, the drying unit 118 has the drying drum (conveying body) 176 and a solvent drying device 178.

The solvent drying device 178, disposed so as to face an outer circumference of the drying drum 176, is constituted of IR (infrared) heaters 182 and a warm air jet nozzle 180 disposed between the IR heaters 182.

The recording medium 124 that has been subjected to the drying process in the drying unit 118 is delivered from the drying drum 176 to a fixing drum 184 of the fixing unit 120 through an intermediate conveying unit 130.

<Fixing Unit>

The fixing unit 120 is constituted of the fixing drum 184, a halogen heater 186, a fixing roller 188, and an in-line sensor 190. When the fixing drum 184 rotates, the recording medium 124 is conveyed with its recording surface facing outward, and the recording surface is then preheated by the halogen heater 186, fixed by the fixing roller 188, and inspected by the in-line sensor 190.

The fixing roller 188 is a roller member that adheres self-dispersible thermoplastic resin particles in the dried ink to each other by applying heat and pressure to the dried ink, in order to form the ink into a film. The fixing roller 188 is configured to apply heat and pressure to the recording medium 124.

According to the fixing unit 120 having the composition described above, the thermoplastic resin particles in the thin image layer formed by the drying unit 118 are heated, pressed and melted by the fixing roller 188, and hence the image layer can be fixed to the recording medium 124.

Moreover, in cases where the ink contains ultraviolet-curable monomer, it possible to improve the strength of the image by irradiating ultraviolet light onto the image in a fixing unit having an ultraviolet irradiation lamp, after the water has been evaporated off sufficiently in the drying unit, thereby curing and polymerizing the ultraviolet-curable monomer.

<Discharge Unit>

The discharge unit 122 is arranged following the fixing unit 120. The discharge unit 122 has a discharge tray 192. Between the discharge tray 192 and the fixing drum 184 of the fixing unit 120 there are arranged a delivery drum 194, conveying belt 196, and stretching roller 198 so as to face the discharge tray 192 and the fixing drum 184. The recording medium 124 is fed to the conveying belt 196 by the delivery drum 194 and then discharged to the discharge tray 192.

Although FIG. 4 illustrates the drum conveyance type inkjet recording apparatus, the present invention is not limited thereto and can also be used in a belt conveyance type inkjet recording apparatus and the like.

EXAMPLES

The present invention is described in further detail using examples below; however, the present invention is not limited thereto.

Experimental Example 1

Practical Example 1

A 20 nm-thick Ti film and a 150 nm-thick (111) Ir film were successively formed as a lower electrode on an Si wafer by sputtering. A Bi, Nb-PZT piezoelectric film was formed on this lower electrode. In forming the Bi, Nb-PZT piezoelectric film, the substrate temperature was set to 450° C. during the film formation in a film formation apparatus. After changing the set temperature in the film formation apparatus, it took approximately 10 minutes for the substrate temperature to actually rise to the set temperature. The total thickness of the Bi, Nb-PZT piezoelectric film was 4 µm.

The other film forming conditions of the piezoelectric film were as described below:

Film formation apparatus: an RF sputtering apparatus ("MPS sputtering system for ferroelectric film formation" manufactured by Ulvac);

Target: a sintered body of $Pb_{1.0}Bi_{0.15}((Zr_{0.52}Ti_{0.48})_{0.88}Nb_{0.12})O_3$ having the diameter of 120 mm;

Film formation power: 500 W;

Substrate-to-target distance: 60 mm;

Film formation pressure: 0.3 Pa; and

Film formation gas: $Ar/O_2$=97.5/2.5 (in molar ratio).

Figure 5:
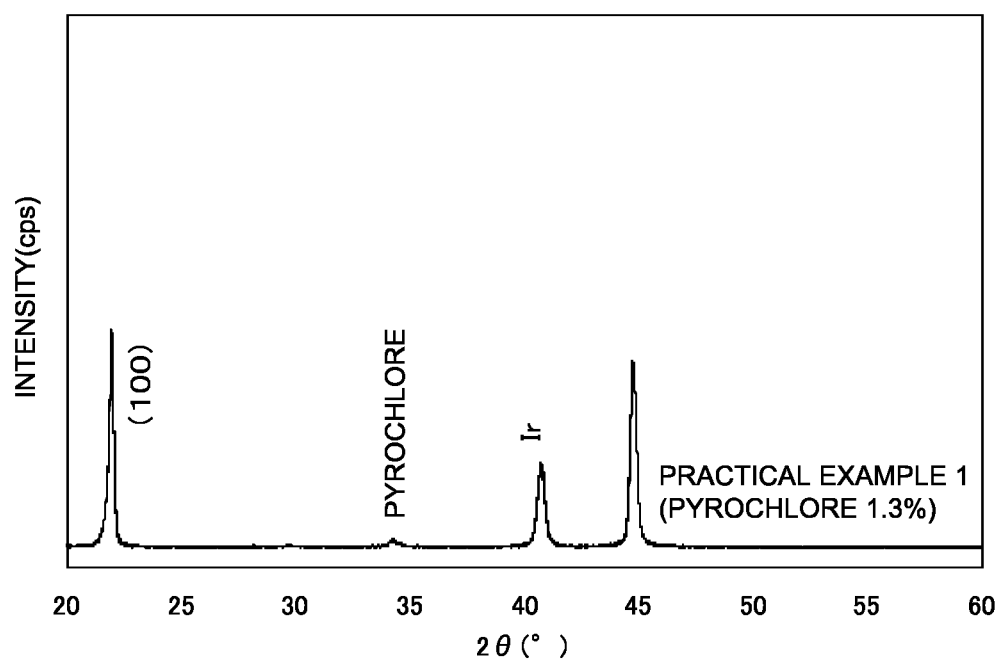
FIG. 5 is a diagram showing an XRD pattern of a piezoelectric film manufactured in Practical Example 1.

The piezoelectric film thus obtained was analyzed with XRD by a θ/2θ measurement method, using an "ULTIMA X-ray diffractometer for thin film evaluation" manufactured by Rigaku. FIG. 5 shows the obtained XRD pattern.

The piezoelectric film thus obtained was a (100) oriented film having the perovskite structure, and the degree of orientation F measured by the Lotgerling method was 99%. No diffraction peaks of pyrochlore phase were observed, and it was then confirmed that the obtained piezoelectric film had a perovskite single-phase structure with good crystalline properties. The diffraction peaks of pyrochlore phase may appear in the vicinities (in the ranges of ±1°) of 2θ=29.4° and 34.1°, respectively derived from the (222) and (400) planes of $Pb_2Nb_2O_7$ pyrochlore.

The pyrochlore amount (ratio) was calculated by ΣI(pyrochlore)/ΣI(perovskite)+ΣI(pyrochlore)), where ΣI(pyrochlore) is the total of the reflection intensity from the pyrochlore phase, and ΣI(perovskite) is the total of the reflection intensity from the perovskite phase. In Practical Example 1, no diffraction peak of the pyrochlore phase was observed, and the pyrochlore amount (ratio) was 1.3%.

The obtained piezoelectric film was subjected to X-ray fluorescence (XRF) analysis using an "X-ray fluorescence spectrometer Axios" manufactured by PANalytical, and the amount (a) of Pb and the amount (b) of Bi (i.e., the A-site dopant) were measured to be a=0.87 and b=0.13.

Finally, the PZT film was subjected to vapor deposition of a Ti/Pt upper electrode (Ti: 20 nm thick/Pt: 150 nm thick; where the Ti layer functions as a bonding layer, and the Pt layer principally functions as the electrode), and a piezoelectric device according to the embodiment of the present invention was obtained.

The thus obtained piezoelectric device was subjected to measurement of the piezoelectric constants $d_{31}(+)$ and $d_{31}(-)$ and the average life span. FIG. 6 shows the corresponding targets, film formation conditions and the results. Each of the $d_{31}$ values shown in FIG. 6 is one of the piezoelectric constants $d_{31}(+)$ and $d_{31}(-)$ which produced greater displacement when the piezoelectric constants $d_{31}(+)$ and $d_{31}(-)$ were measured. Furthermore, the driving for determining the average life span was set to the driving direction producing the greater displacement.

Comparative Example 1

A Bi, Nb-PZT piezoelectric film was formed on the lower electrode by using a sintered body of $Pb_{1.3}Bi_{0.07}((Zr_{0.52}Ti_{0.48})_{0.88}Nb_{0.12})O_3$ as a target. The film formation was carried out at a substrate temperature of 510° C. The other conditions were the same as Practical Example 1.

Comparative Example 2

Film formation was carried out by a method similar to that of Practical Example 1, apart from the fact that a Nb-PZT piezoelectric film was formed on the lower electrode using a sintered body of $Pb_{1.3}((Zr_{0.52}Ti_{0.48})_{0.88}Nb_{0.12})O_3$ as a target.

Comparative Example 3

A Nb-PZT piezoelectric film was formed on the lower electrode by using a sintered body of $Pb_{1.3}((Zr_{0.52}Ti_{0.48})_{0.88}Nb_{0.12})O_3$ as a target. A 150 nm-thick initial layer was formed at a substrate temperature of 420° C., whereupon the set substrate temperature was changed to 510° C. and subsequently film formation for the main layer was carried out. The other conditions were the same as Practical Example 1.

Comparative Example 4

A 150 nm-thick initial layer was formed at a substrate temperature of 420° C., whereupon the set substrate temperature was changed to 540° C. and film formation for the main layer was carried out. The other conditions were the same as Comparative Example 3.
<Results>

In Comparative Example 2, which was the same with a film formation method in the related art, the film formation was performed in one stage, a pyrochlore phase was formed, and it was impossible to obtain a film of good quality. In Comparative Example 3, which was the same with a film formation method in the related art, the operation was complex because the temperature was changed during the course of film formation, although the piezoelectric constants and life span (durability) were good.

In Comparative Example 1, Bi of 5% was added to adjust the composition of the film after formation so that the total amount of Pb and Bi was not less than 1, and the amount of Nb was greater than the amount of Bi, then it was possible to obtain a perovskite single-phase film having a Pb amount of less than 1 by a one-stage film formation process. In respect of the life span, it was possible to obtain the piezoelectric film similar to that formed by a two-stage process.

In Comparative Examples 2 and 3, no Bi was added and film formation was carried out by a two-stage film formation process. It was also possible to obtain a satisfactory perovskite thin film in the film having the Pb amount of 0.97 (Comparative Example 3), but the film having the Pb amount of 0.88 (Comparative Example 4) was a pyrochlore thin film.

In Practical Example 1, as a result of adjusting the composition of the film after formation so that the total amount of Pb and Bi was not less than 1, it was possible to reduce the amount of Pb by increasing the amount of Bi, and therefore it was possible to obtain the film having a small amount of Pb and improved life span.

Experimental example 2

Comparative Example 5

Film formation was carried out by a method similar to that of Practical Example 1, apart from the fact that a sintered body of $Pb_{1.3}Bi_{0.15}((Zr_{0.52}Ti_{0.48})_{0.88}Nb_{0.12})O_3$ was used as a target.
<Results>

In Comparative Example 5, the composition of the film after formation was adjusted in such a manner that the amount of Bi was the same and the amount of Pb was greater, compared to Practical Example 1. The film obtained in Comparative Example 5 had the greater amount of lead and shorter life span, compared to Practical Example 1. Consequently, it is considered that results where the life span was extended were not due to only the addition of Bi, but rather, the addition of Bi made it possible to form the film having the small amount of Pb, and the life span was extended for this reason. Moreover, when the amount of Pb was large, then there was a tendency for the piezoelectric constant to become low. It was confirmed that by making the amount of Pb less than 1, it was possible to maintain the piezoelectric constant.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric film which has a columnar crystal structure constituted of a plurality of columnar crystals, and contains a perovskite oxide represented by the following formula (P) as a main component:

$$Pb_aA_b[(Zr_cTi_{1-c})_{1-d}B_d]O_e, \quad (P)$$

wherein
Pb and A are A-site elements, and A is at least one element selected from a group consisting of Bi, La, Ce, Pr, Nd, Sm, Eu, Gd, Tb, Dy, Ho, Er, Tm, Yb, Lu, Ca, Sr and Ba;
Zr, Ti and B are B-site elements, and B is at least one element selected from a group consisting of Nb, Ta and Sb;
a is an amount of lead,
b is an amount of the element A,
c is a Zr/Ti ratio,
d is an amount of the element B,
e is an amount of oxygen;
values of a, b and d satisfy $a<1$, $a+b\geq 1$, and $0<d<b$;
$e=3$; and
the value of d in the formula (P) satisfies $0.1<d<0.2$.

2. The piezoelectric film as defined in claim 1, wherein film formation conditions are not changed during film formation processing of the piezoelectric film.

3. The piezoelectric film as defined in claim 1, wherein the value of a in the formula (P) satisfies $a<0.97$.

4. The piezoelectric film as defined in claim 1, wherein the value of c in the formula (P) satisfies $0.45<c<0.55$.

5. The piezoelectric film as defined in claim 1, wherein the element A in the formula (P) is Bi.

6. The piezoelectric film as defined in claim 1, wherein the element B in the formula (P) is Nb.

7. A piezoelectric device, comprising:
the piezoelectric film as defined in claim 1; and
electrodes through which an electric field is applied to the piezoelectric film.

8. The piezoelectric film as defined in claim 2, wherein the film formation conditions involve temperature control.

9. A liquid ejection apparatus, comprising:
the piezoelectric device as defined in claim 7; and
a liquid ejection member which is arranged integrally with or separately from the piezoelectric device,
wherein the liquid ejection member includes a liquid storage chamber in which liquid is stored, and a liquid ejection port through which the liquid is ejected externally from the liquid storage chamber.

* * * * *